(12) United States Patent
Wei et al.

(10) Patent No.: US 12,168,604 B2
(45) Date of Patent: Dec. 17, 2024

(54) MICRO-NANO INCREMENTAL MECHANICAL SURFACE TREATMENT METHOD

(71) Applicant: NANJING UNIVERSITY OF AERONAUTICS AND ASTRONAUTICS, Nanjing (CN)

(72) Inventors: Hongyu Wei, Nanjing (CN); Laishui Zhou, Nanjing (CN); Huiliang Zhang, Nanjing (CN); Ghulam Hussain, Nanjing (CN); Wanlin Zhou, Nanjing (CN); Haiji Chen, Nanjing (CN); Xiao Zhang, Nanjing (CN); Lili Dong, Nanjing (CN)

(73) Assignee: NANJING UNIVERSITY OF AERONAUTICS AND ASTRONAUTICS, Nanjing (CN)

( * ) Notice: Subject to any disclaimer, the term of this patent is extended or adjusted under 35 U.S.C. 154(b) by 618 days.

(21) Appl. No.: 17/419,818

(22) PCT Filed: Jul. 1, 2020

(86) PCT No.: PCT/CN2020/099667
§ 371 (c)(1),
(2) Date: Jun. 30, 2021

(87) PCT Pub. No.: WO2021/077795
PCT Pub. Date: Apr. 29, 2021

(65) Prior Publication Data
US 2022/0063992 A1 Mar. 3, 2022

(30) Foreign Application Priority Data
Dec. 30, 2019 (CN) .......................... 201911392006.7

(51) Int. Cl.
*B81C 1/00* (2006.01)

(52) U.S. Cl.
CPC ........ *B81C 1/0046* (2013.01); *B81C 1/00023* (2013.01); *B81C 1/00642* (2013.01); *B81C 2201/0102* (2013.01)

(58) Field of Classification Search
CPC .............. B29C 1/0046; B29C 1/00023; B29C 1/00642; B29C 1/00444; B23P 9/00; B23P 9/04; B81C 1/00444
See application file for complete search history.

(56) References Cited

U.S. PATENT DOCUMENTS 7,300,622 B2 * 11/2007 Lu .............................. C23C 8/02
148/241
8,782,902 B2 * 7/2014 Pyun ....................... B24B 35/00
29/898.13
(Continued)

FOREIGN PATENT DOCUMENTS

| CN | 102119068 A | * | 7/2011 | ............. B24B 35/00 |
| CN | 107587086 | * | 1/2018 | ............... C22F 1/06 |
| CN | 108411085 B | * | 1/2020 | ............... C21D 7/06 |

*Primary Examiner* — Nahida Sultana
(74) *Attorney, Agent, or Firm* — Proi Intellectual Property US

(57) ABSTRACT

A micro-nano incremental mechanical surface treatment method, comprising the following steps: using a modification tool having a designable end to contact a surface of a substrate material, rotating the modification tool in a local region and compressing the material surface, presetting processing parameters by means of 3D modeling software, and after the tool has processed the entire surface, enabling the tool to move downwards to the indented surface compressed previously. The process continues until the surface material is compressed to a pre-defined thickness, thereby achieving the goals of grain refinement and surface performance improvement. By means of the present method, a workpiece having a complex shape can be flexibly and (Continued)

designably surface modified. The method has the advantages of high bonding strength, no pollution, and low cost.

6 Claims, 2 Drawing Sheets

(56) References Cited

U.S. PATENT DOCUMENTS

| | | | |
|---|---|---|---|
| 9,885,691 B1* | 2/2018 | Daugela | G01N 29/2437 |
| 2006/0237104 A1* | 10/2006 | Statnikov | B23K 13/00 |
| | | | 148/400 |

* cited by examiner

MICRO-NANO INCREMENTAL MECHANICAL SURFACE TREATMENT METHOD

TECHNICAL FIELD

The present invention belongs to the field of surface engineering, and particularly relates to a micro-nano incremental mechanical surface treatment (MIMST) method.

BACKGROUND ART

A surface engineering technology is of great significance for modifying products and improving performance (such as wear resistance, corrosion resistance and temperature resistance), and is known as one of the key manufacturing technologies in the 21$^{st}$ century. Based on excellent characteristics of the size effect of micro-nano materials, a surface micro-nano modification technology developed by combining a micro-nano technology with surface engineering has become a current research hotspot in surface engineering. However, the existing modification technologies generally have problems of poor bonding strength, difficulty in coating materials in complex shapes, low yield, low efficiency, environmental pollution, etc. Therefore, the requirements of product performance, economic performance, environmental protection and sustainable development are difficult to meet.

SUMMARY OF THE INVENTION

The present invention provides a micro-nano incremental mechanical surface treatment (MIMST) method. By means of the method, a workpiece having a complex shape can be flexibly and designably surface modified. The method has the advantages of high bonding strength, no pollution, and low cost.

In order to achieve the above objectives, the present invention adopts the following technical solution:

A micro-nano incremental mechanical surface treatment (MIMST) method includes the following steps:

(1) using an end of a modification tool to contact a surface of a substrate material, and presetting moving parameters of the modification tool by means of 3D modeling software;

(2) rotating the modification tool in a local region of the surface of the substrate material, and moving the modification tool according to preset moving parameters in step (1) to compress the surface of the substrate material;

(3) after the modification tool has processed the entire surface of the substrate material, enabling the modification tool to move downwards to the indented surface compressed previously; and (4) repeating step (2) and step (3) until the substrate material is compressed to a preset thickness.

In the above steps, the end of the modification tool is a ball head, a flat head or a needle head. The moving parameters in step (1) include a moving path, a tool rotating speed, a feeding speed, a single-layer downward compressing amount, a processing pass and a secondary feeding overlapping rate. The moving path is, for example, of a unidirectional type, a reciprocating type, a lattice type or a spiral type. The tool rotating speed is in a range of 1000 rpm to 30000 rpm. The feeding speed is in a range of 1000 mm/min to 6000 mm/min. The single-layer downward compressing amount is in a range of 0.01 mm to 0.1 mm. The processing pass is in a range of 10 times to 30 times. The secondary feeding overlapping rate is in a range of 2% to 10%. In step (3), a downward moving distance is controlled according to the preset single-layer downward compressing amount. In the whole processing process above, the modification tool is assisted by an ultrasonic vibration device. A static pressure of ultrasonic vibration of the ultrasonic vibration device is in a range of 150 N to 350 N, and a vibration amplitude is in a range of 2 μm to 7 μm. In the whole processing process, the required processing atmosphere and lubricating conditions are able to be provided according to different substrate materials and expected objectives.

Beneficial effects: The present invention provides the micro-nano incremental mechanical surface treatment (MIMST) method combining mechanical, numerical control and micro-nano manufacturing and surface engineering technologies, and introduces rotation friction, ultrasonic vibration, numerical control technology and surface metallurgy integration into the field of metal surface engineering. Due to the introduction of the numerical control, a computer aided technology can be sufficiently utilized, the 3D metallic structure surface micro-nano manufacturing of various complex shapes can be efficiently realized, and the modification efficiency and accuracy are improved. Moreover, a mechanical action mode is adopted, that is, a Micro-nano Incremental Mechanical Surface Treatment (MIMST) process is adopted for induction, and ultrasonic excitation assistance is introduced to directly act on the surface of the material to realize the self-growth of the surface micro-nano structure. Due to the existence of micro-nano crystal layers, the mechanical and physical and chemical properties of a surface layer material can be significantly improved. A further chemical treatment capability (such as carburization, nitridation and metallic particles) can be greatly improved. By means of a mechanical treatment mode accompanied by surface activity increase, great possibility and convenience are provided for further development of a novel functional composite surface. The method of the present invention is relatively high in treatment efficiency, and has the advantages of high bonding strength, no pollution and low cost, the substrate and the nanometer crystal layer have no obvious separation interface, and the green production of surface engineering can be realized.

DETAILED DESCRIPTION OF THE INVENTION

The present invention will be described in detail below with reference to the drawings and specific embodiments:

Embodiment 1

Figure 1:
FIG. 1 is a schematic diagram of a modification tool with a ball head end.
Figure 4:
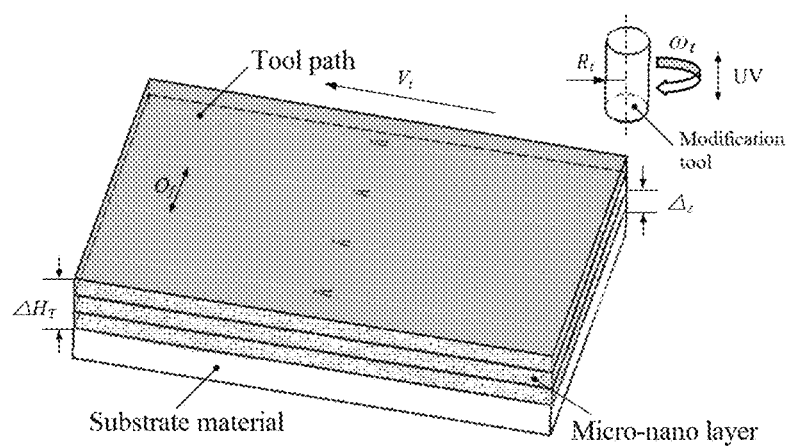
FIG. 4 is a modification technology principle diagram of the method of the present invention, where $\Delta_Z$ is a single-layer downward compressing amount, $\omega_t$ is a tool rotating speed, $V_t$ is a tool feeding linear speed, $R_t$ is a tool radius, $\Delta_d$ is a secondary feeding overlapping rate, $\Delta_t$ is a total downward compressing amount, and $N_P$ is a processing pass.

As shown in FIG. 4, a micro-nano incremental mechanical surface treatment (MIMST) method includes the following steps:

An end of an 8 mm ball head modification tool as shown in FIG. 1 is used to contact a 7075-T6 aluminum alloy substrate material. Under oil lubricating conditions, moving parameters of the modification tool are preset by means of 3D modeling software: a tool rotating speed is 18000 rpm, a tool feeding linear speed is 6000 mm/min, a single-layer downward compressing amount is 0.03 mm, and a secondary feeding overlapping rate is 2%. The modification tool is rotated in a local region, and moves according to the preset paths to compress the surface of the material. After the tool has processed the entire surface, the tool moves downwards to the indented surface compressed previously. A moving distance is controlled according to the preset single-layer downward compressing amount. This process is continued until the surface material is compressed to a predefined thickness.

Figure 5:
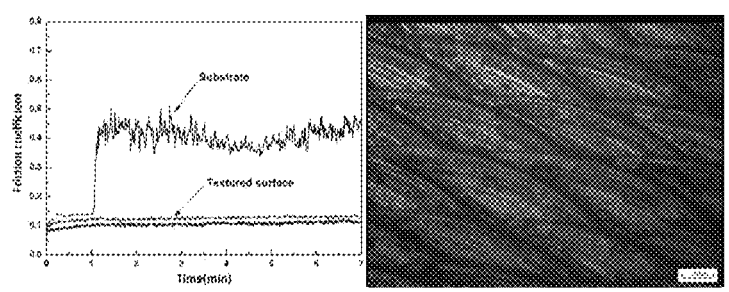
FIG. 5 shows a friction coefficient curve graph and a view of a textured surface of a modified material according to Embodiment 1 of the present invention.

A microhardness of the modified material is improved from 79.4 HV to 125.1 HV, increasing by 57.6%, compared with that of the 7075-T6 aluminum alloy substrate material, as shown in FIG. 5, and average friction coefficients in directions of 0°, 45° and 90° are respectively lowered from 0.395 to 0.126, 0.105 and 0.107, compared with that of the 7075-T6 aluminum alloy substrate material.

Embodiment 2

As shown in FIG. 4, a micro-nano incremental mechanical surface treatment (MIMST) method includes the following steps:

An end of an 8 mm ball head modification tool as shown in FIG. 1 is used to contact a 7075-T6 aluminum alloy substrate material. Under oil lubricating conditions, moving parameters of the modification tool are preset by means of 3D modeling software: a tool rotating speed is 6000 rpm, a tool feeding linear speed is 4000 mm/min, a single-layer downward compressing amount is 0.02 mm, and a secondary feeding overlapping rate is 2%. The modification tool is rotated in a local region, and moves according to the preset paths to compress the surface of the material. After the tool has processed the entire surface, the tool moves downwards to the indented surface compressed previously. A moving distance is controlled according to the preset single-layer downward compressing amount. This process is continued until the surface material is compressed to a predefined thickness.

A microhardness of the modified material is improved from 79.4 HV to 118.6 HV, increasing by 49.4%, compared with that of the 7075-T6 aluminum alloy substrate material, and an average friction coefficient is lowered from 0.395 to 0.126, compared with that of the 7075-T6 aluminum alloy substrate material.

Embodiment 3

As shown in FIG. 4, a micro-nano incremental mechanical surface treatment (MIMST) method includes the following steps:

An end of an 8 mm ball head modification tool as shown in FIG. 1 is used to contact a 7075-T6 aluminum alloy substrate material. Under oil lubricating conditions, moving parameters of the modification tool are preset by means of 3D modeling software: a tool rotating speed is 12000 rpm, a tool feeding linear speed is 4000 mm/min, a single-layer downward compressing amount is 0.03 mm, and a secondary feeding overlapping rate is 8%. The modification tool is rotated in a local region, and moves according to the preset paths to compress the surface of the material. After the tool has processed the entire surface, the tool moves downwards to the indented surface compressed previously. A moving distance is controlled according to the preset single-layer downward compressing amount. This process is continued until the surface material is compressed to a predefined thickness.

A microhardness of the modified material is improved from 79.4 HV to 104.6 HV, increasing by 31.7%, compared with that of the 7075-T6 aluminum alloy substrate material, and an average friction coefficient is lowered from 0.395 to 0.269, compared with that of the 7075-T6 aluminum alloy substrate material.

Figure 2:
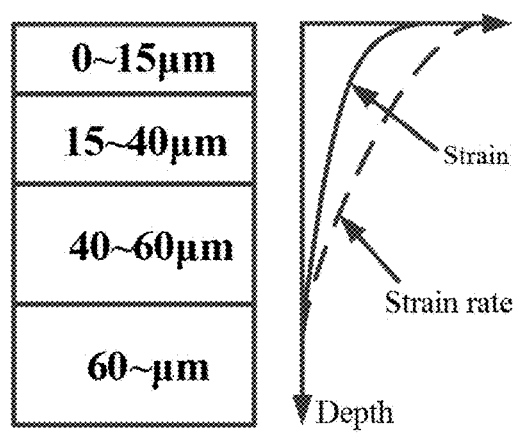
FIG. 2 is a schematic diagram of a modification layer full-thickness microstructure and stress/strain of a method of the present invention.
Figure 3:
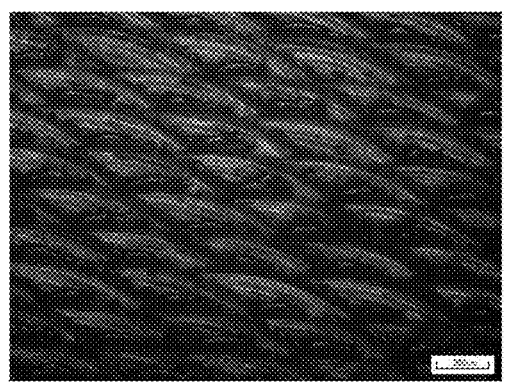
FIG. 3 is a schematic structural diagram of texture of a material surface modified by the method of the present invention.

As shown in a schematic diagram of a modification layer full-thickness microstructure and stress/strain in FIG. 2, plastic deformation tends to reduce the grain size of the material, and frictional heat generated at the interface of the modification tool/material surface is also favorable for re-adjustment of the surface grain size. As shown in a schematic diagram of a material surface texture structure after modification in FIG. 3, plastic flow may also cause the surface texturing of the material, and the tribological performance of the material can be effectively improved through the surface texturing of the material, so that the surface attributes newly generated are a combined result of residual stress, grain refinement and texturing.

The above descriptions are only the exemplary implementations of the present invention. It should be pointed out that for a person of ordinary skill in the art, without departing from the principle of the present invention, several improvements and modifications can also be made, and these improvements and modifications should also fall within the protection scope of the present invention.

The invention claimed is:

1. A micro-nano incremental mechanical surface treatment method, comprising the following steps:
    (1) using an end of a modification tool to contact a surface of a substrate material, and presetting moving parameters of the modification tool by means of 3D modeling software;
    (2) rotating the modification tool in a local region of the surface of the substrate material, and moving the modification tool according to preset moving parameters in step (1) to compress the surface of the substrate material;
    (3) after the modification tool has processed the entire surface of the substrate material, enabling the modification tool to move downwards to the indented surface compressed previously; and
    (4) repeating step (2) and step (3) until the substrate material is compressed to a preset thickness:
    wherein the moving parameters in step (1) comprise a moving path, a tool rotating speed, a feeding speed, a single-layer downward compressing amount, a processing pass and a secondary feeding overlapping rate;
    wherein the moving path is a unidirectional, a reciprocating, a lattice, or a spiral, the tool rotating speed is in a range of 1000 rpm to 30000 rpm, the feeding speed is in a range of 1000 mm/min to 6000 mm/min, the single-layer downward compressing amount is in a range of 0.01 mm to 0.1 mm, the processing pass is in a range of 10 times to 30 times, and the secondary feeding overlapping rate is in a range of 2% to 10%.

2. The micro-nano incremental mechanical surface treatment method according to claim 1, wherein in step (3), a downward moving distance is controlled according to the preset single-layer downward compressing amount.

3. The micro-nano incremental mechanical surface treatment method according to claim 1, wherein in the whole processing process, the modification tool is assisted by an ultrasonic vibration device.

4. The micro-nano incremental mechanical surface treatment method according to claim 3, wherein a static pressure of ultrasonic vibration of the ultrasonic vibration device is in a range of 150 N to 350 N, and a vibration amplitude is in a range of 2 µm to 7 µm.

5. The micro-nano incremental mechanical surface treatment method according to claim 1, wherein the end of the modification tool is a ball head, a flat head or a needle head.

6. The micro-nano incremental mechanical surface treatment method according to claim 1, wherein in step (3), a downward moving distance is controlled according to the preset single-layer downward compressing amount.

* * * * *